(12) United States Patent
Lam et al.

(10) Patent No.: US 6,806,786 B1
(45) Date of Patent: Oct. 19, 2004

(54) PHASE-LOCKED LOOP WITH SELF-SELECTING MULTI-BAND VCO

(75) Inventors: Christopher Lam, Rowland Heights, CA (US); Thai Nguyen, San Jose, CA (US); Chet Sooraparth, Mountain View, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 242 days.

(21) Appl. No.: 10/143,529

(22) Filed: May 9, 2002

Related U.S. Application Data
(60) Provisional application No. 60/291,040, filed on May 15, 2001.

(51) Int. Cl.[7] ................................................ H03B 1/00
(52) U.S. Cl. ....................................... 331/179; 327/147
(58) Field of Search ........................... 331/179, 10, 16, 331/17, 177; 327/147, 156, 162; 375/375, 376

(56) References Cited

U.S. PATENT DOCUMENTS 6,091,304 A * 7/2000 Harrer ......................... 331/10
6,417,740 B1 * 7/2002 Anh et al. ..................... 331/48
6,470,191 B1 * 10/2002 Nielsen et al. ........... 455/552.1

* cited by examiner

Primary Examiner—Linh M. Nguyen
(74) Attorney, Agent, or Firm—Withrow & Terranova, PLLC

(57) ABSTRACT

Techniques to select the proper frequency band for use in a PLL from among multiple frequency bands of a multi-band VCO. The PLL comprises a detector, a loop filter, the multi-band VCO, and a control unit. The detector receives a first signal to be locked to and a second signal that is related to a VCO signal and provides a detector output. The loop filter filters the detector output to provide a control signal. The multi-band VCO selects one of the multiple frequency bands based on a select signal and provides the VCO signal at a frequency determined by the control signal. The control unit derives the select signal for the multi-band VCO based on information extracted from a third signal (e.g., a filtered version of the control signal) and a timing signal from a timer unit.

23 Claims, 5 Drawing Sheets

PHASE-LOCKED LOOP WITH SELF-SELECTING MULTI-BAND VCO

CROSS-REFERENCES TO RELATED APPLICATIONS

This application claims the benefit of provisional U.S. application Ser. No. 60/291,040, entitled "Suggested Self-Selection Scheme on a Multiple Band VCO for the PLL," filed May 15, 2001, which is incorporated herein by reference in its entirety for all purposes.

BACKGROUND OF THE INVENTION

The present invention relates generally to circuits, and more specifically to techniques for self-selecting the proper frequency band for use in a multi-band voltage controlled oscillator (VCO) within a phase-locked loop (PLL).

A VCO is a circuit used to generate a periodic signal that may be used for various applications. The VCO signal has a particular waveform (e.g., a sinusoid, square wave, or some other shape) and a particular frequency. Depending on the application being supported, the VCO may need to provide the VCO signal at a predetermined fixed frequency or a range of frequencies.

A common use of a VCO is within a phase-locked loop (PLL). The PLL is able to provide a periodic signal having an accurate frequency based on a reference signal from an accurate signal source, which may be a voltage controlled crystal oscillator (VCXO) or some other oscillator. The PLL locks the frequency and/or phase of the VCO to that of the reference signal by (1) dividing down the VCO signal by a factor of Q, (2) comparing the divided down VCO signal and the (undivided or divided down) reference signal, (3) generating a control signal for the VCO based on the result of the comparison, and (4) adjusting the frequency/phase of the VCO based on the control signal. This mechanism allows the VCO to achieve the frequency accuracy of the reference signal. The PLL is able to provide different frequencies for the VCO signal by using different divider factors for the VCO signal and/or the reference signal.

A VCO needs to be designed with the capability to tune or adjust its frequency over a range that is sufficient to cover a specified range of operating frequencies under expected worst-case conditions. The tuning range denotes the total range of frequencies that may be provided by the VCO with the control signal set at the maximum and minimum values. Depending on the application for which the PLL will be used, the specified operating frequency range may be a single frequency or a range of frequencies. The worst-case conditions may result from different supply voltages, variations in manufacturing process, component tolerances, and so on.

Conventionally, most PLLs employ a single-band VCO that provides a single range of frequencies (or frequency band) for the VCO signal based on the control signal. This single frequency band would then constitute the entire tuning range for the VCO. For a conventional PLL with a single-band VCO, the tuning range of the VCO needs to cover the specified operating frequency range under the expected worst-case conditions. To obtain a large tuning range, the gain of the VCO (which is often denoted as $K_{VCO}$) may be relatively large. The VCO gain is defined as the change in the VCO frequency versus the change in the control signal amplitude, i.e., the slope of a transfer function for VCO frequency versus control voltage.

A large VCO gain is typically undesirable for several reasons. First, a large VCO gain typically implies that the VCO will be more sensitive to noise, since a small change (e.g., due to noise) in the control signal results in a relatively large change in the VCO frequency. Second, a large VCO gain may result in degraded phase noise on the VCO signal. This is because a large tuning range is typically obtained by using a larger varactor (or variable capacitor). A smaller inductor would need to be used with the larger varactor to achieve a given center frequency since $f \propto 1/\sqrt{LC}$. For any given frequency, the quality factor of an inductor is approximately proportional to the inductor value. The signal swing of the VCO is reduced for a lower quality factor, and the smaller signal swing results in poorer phase noise on the VCO signal. The degradation in phase noise may be reduced by designing the VCO with greater drive capability, which would consume more power. However, higher power consumption is undesirable for many applications.

A multi-band VCO provides multiple ranges of frequencies (or multiple frequency bands) that collectively represent the overall tuning range of the VCO. By dividing the tuning range into multiple overlapping frequency bands, the VCO gain may be reduced since the full range of the control signal corresponds to a smaller range of frequencies for one frequency band. The smaller VCO gain of the multi-band VCO may then ameliorate many of the disadvantages described above for the single-band VCO.

Because multiple frequency bands are present in a multi-band VCO, the proper frequency band needs to be selected for use at any given moment. Thus, techniques for self-selecting the proper frequency band of the multi-band VCO are highly desirable.

SUMMARY OF THE INVENTION

Techniques are provided herein to select the proper frequency band for use in a PLL from among multiple frequency bands of a multi-band VCO. In an aspect, the band selection is achieved based on a digital representation of the trend of an analog signal to provide improved. This analog signal may be a control signal used to adjust the frequency of the VCO or some other related signal.

A specific embodiment of the invention provides a PLL comprising a detector, a loop filter, a multi-band VCO, and a control unit. The detector receives first and second signals and provides a detector output, with the first signal being related to a reference signal to be locked to and the second signal being related to the VCO signal. The loop filter receives and filters the detector output to provide a control signal. The multi-band VCO receives the control signal and a select signal, selects one of the multiple frequency bands based on the select signal, and provides the VCO signal at a frequency within the selected frequency band determined based on the control signal. The control unit receives a third signal and provides the select signal for the multi-band VCO. The third signal is related to the control signal, and may be a filtered version of the control signal or the control signal itself.

In an embodiment, the control unit includes first and second comparators, a timer unit, and a decision logic unit. The first comparator receives the third signal and a first threshold value and provides a first status signal indicative of whether or not the frequency of the VCO signal is too high. Similarly, the second comparator receives the third signal and a second threshold value and provides a second status signal indicative of whether or not the frequency of the VCO signal is too low. The timer unit provides a timing signal that may include strobes (e.g., pulses) at regular intervals, which may be determined based on the amount of time needed to achieve frequency lock by the PLL. The decision logic derives the select signal based on the first and second status signals from the comparators and the timing signal from the timer unit. The control unit typically evaluates one or more candidate frequency bands to determine the proper frequency band to use, which may be the one that has not changed within a particular amount of time.

Various other aspects, embodiments, and features of the invention are also provided, as described in further detail below.

The foregoing, together with other aspects of this invention, will become more apparent when referring to the following specification, claims, and accompanying drawings.

DESCRIPTION OF THE SPECIFIC EMBODIMENTS

Figure 1:
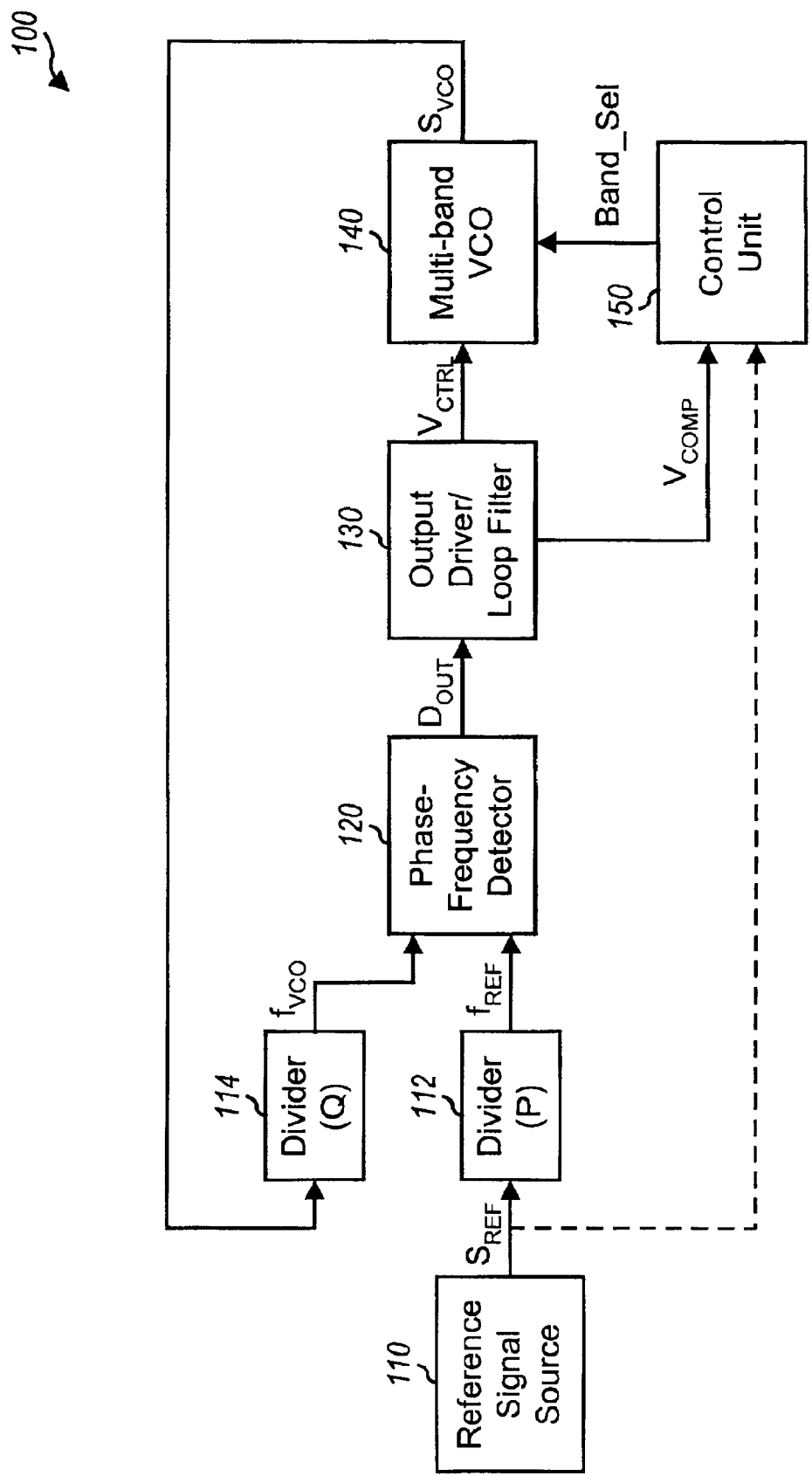
FIG. 1 is a block diagram of an embodiment of a phase-locked loop (PLL) that employs a self-selecting multi-band VCO.

FIG. 1 is a block diagram of an embodiment of a phase-locked loop (PLL) 100 that employs a multi-band VCO and a scheme for self-selecting the proper frequency band for use from among multiple frequency bands.

As shown in FIG. 1, a reference signal source 110 provides a reference signal, $S_{REF}$, to a frequency divider 112. Reference signal source 100 is typically a high accuracy signal source that may be implemented with a voltage controlled crystal oscillator (VCXO), a temperature compensated crystal oscillator (TCXO), a temperature compensated voltage controlled crystal oscillator (TCVCXO), or some other oscillator design Reference signal source 110 may also represent the source of a signal to be acquired and tracked by the PLL. Divider 112 divides the frequency of the reference signal by a factor of P, where P may be any value of one or greater. Divider 112 generates a divided down reference signal, $f_{REF}$, that is then provided to a phase-frequency detector 120.

A multi-band VCO 140 provides an output signal, $S_{VCO}$, to a frequency divider 114. Divider 114 similarly divides the frequency of the VCO signal down by a factor of Q, where Q may be any value of one or greater, and is typically different from P. Divider 114 generates a divided down VCO signal, $f_{VCO}$, that is then provided to phase-frequency detector 120. Dividers 112 and 114 may each be implemented with a counter, flip-flops, or some other circuit designs. The divider factors P and Q may each be an integer value or a non-integer value. A non-integer divider factor may be obtained with a fractional divider or swallow counter, as is known in the art.

Phase-frequency detector 120 receives the signals from dividers 112 and 114, determines the instantaneous difference in phase (or frequency) between the two received signals, and provides a detector output, $D_{OUT}$, to an output drive/loop filter 130. Phase-frequency detector 120 may be implemented with an "early-late" detector or some other detector design, as is known in the art. In an embodiment, phase-frequency detector 120 is implemented with an early-late detector that provides two output signals, Up and Down, as the detector output, $D_{OUT}$. The Up signal is asserted (e.g., to logic high) if the phase (or leading edge) of the reference signal is early with respect to the phase of the VCO signal, and the Down signal is asserted if the phase of the VCO signal is early with respect to the phase of the reference signal. Opposite logic may also be used for the Up and Down signals, depending on the specific design of the PLL.

Output driver/loop filter 130 receives the detector output, $D_{OUT}$, provides an appropriate drive signal based on the detector output, and filters this drive signal to provide a control signal, $V_{CTRL}$, for multi-band VCO 140. The output driver may be implemented with a charge pump, a buffer, an amplifier, or some other design. The loop filter may implement a first order, a second order, or a higher order loop filter. The loop filter also has a response and a bandwidth selected to provide a desired loop response and bandwidth for the PLL.

Multi-band VCO 140 is a VCO with multiple (N) frequency bands, each of which covers a respective range of frequencies. These multiple frequency bands overlap and collectively comprise the overall tuning range of the VCO. For a given tuning range, the multi-band VCO has a smaller VCO gain than that of a comparable single-band VCO with the same tuning range. Multi-band VCO 140 receives the control signal, $V_{CTRL}$, from output driver/loop filter 130, and a control, Band_Sel, from a control unit 150. Multi-band VCO 140 then selects one of the N frequency bands based on the Band_Sel control and operates in the selected frequency band. The $V_{CTRL}$ control signal determines the frequency of the VCO signal within the selected frequency band. The frequency of the VCO signal is thus dependent on both the $V_{CTRL}$ control signal and the Band_Sel control.

Figure 2:
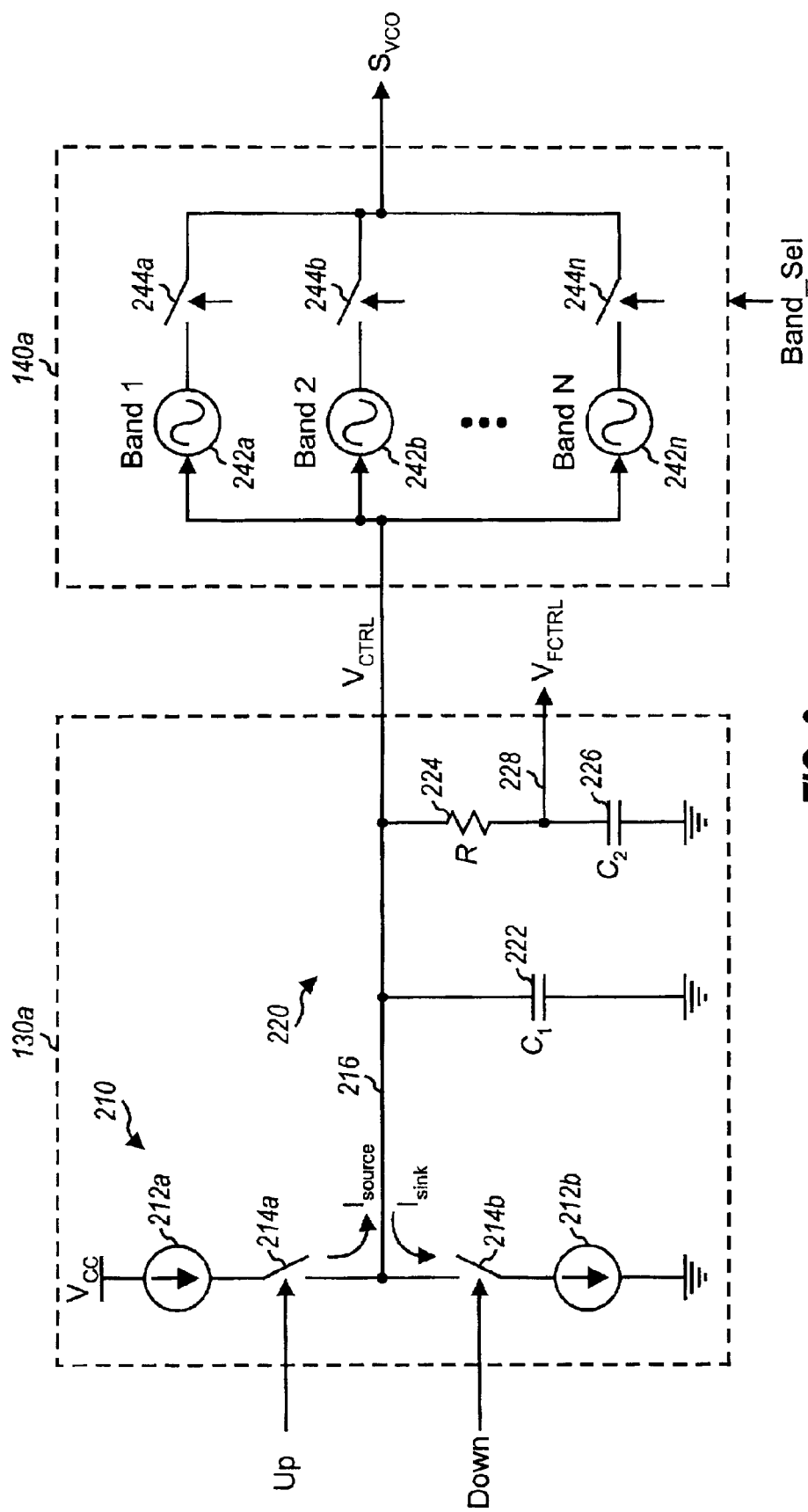
FIG. 2 is a block diagram of an output driver/loop filter and the multi-band VCO within the PLL.

FIG. 2 is a block diagram of an output driver/loop filter 130a and a multi-band VCO 140a, which are a specific embodiment of output driver/loop filter 130 and multi-band VCO 140, respectively, in FIG. 1. In this embodiment, output driver/loop filter 130a includes (1) an output driver implemented with a charge pump 210 and (2) a loop filter implemented with a second order loop filter 220.

Charge pump 210 includes a pair of current sources 212a and 212b coupled in series with a pair of switches 214a and 214b, the combination of which couples between a positive power supply ($V_{CC}$) and a negative power supply (circuit ground). Charge pump 210 receives the Up and Down signals from the early-late detector within phase-frequency detector 120. Only one of the these two signals is asserted (if at all) at any given moment, depending on the relative phase of the two input signals to the early-late detector. When the Up signal is asserted, switch 214a is closed, and current source 212a provides current on line 216. Conversely, when the Down signal is asserted, switch 214b is closed, and current source 212b sinks current from line 216.

Current source 212a and switch 214a may be implemented with a P-channel transistor, and current source 212b and switch 214b may be implemented with an N-channel transistor, as is known in the art. The Up and Down signals would then be provided with the appropriate logic to properly turn ON and OFF these transistors. Current sources 212a and 212b may also be designed to respectively provide approximately equal amounts of sourcing and sinking current, when enabled, to provide improved loop performance.

Loop filter 220 includes (1) a capacitor 222 coupled between line 216 and circuit ground and (2) a resistor 224 coupled in series with a capacitor 226, the combination of which couples between line 216 and circuit ground. Loop filter 220 is a second-order loop filter having a pole at $(C_1+C_2)/RC_1C_2$ provided by capacitor 222 and the series combination of resistor 224 and capacitor 226 and a zero at $1/RC_2$ provided by the series combination of resistor 224 and capacitor 226.

As shown in FIG. 2, multi-band VCO 140a illustratively includes N VCOs 242a through 242n coupled in parallel. Each VCO 242 provides an output signal for a respective frequency band. Each VCO 242 couples in series with an associated switch 244 that is used to select that VCO. Only one of the N VCOs is selected and turned ON at any given moment, based on the Band_Sel control.

FIG. 2 shows a conceptual view of the multi-band VCO. In a practical implementation, a multi-band VCO may provide multiple frequency bands via multiple sets of reactive components (e.g., multiple sets of capacitors and possibly inductors). Each frequency band may be selected by enabling or connecting the proper set (or sets) of reactive components. One set of varactors may be used to adjust the frequency for all of the bands. This design reduces component count by using the same active and passive components to implement the amplifier and supporting circuitry for the multi-band VCO.

The multi-band VCO is able to ameliorate some of the disadvantages described above for the single-band VCO. In particular, the multi-band VCO is less susceptible to noise perturbation on its control signal in comparison to a single-band VCO with the same tuning range. This is because each frequency band of the multi-band VCO covers only a portion of the overall tuning range. Since the gain of multi-band VCO tends to be smaller, the multi-band VCO has smaller reference spur performance comparable to that of the single-band VCO.

Figure 3:
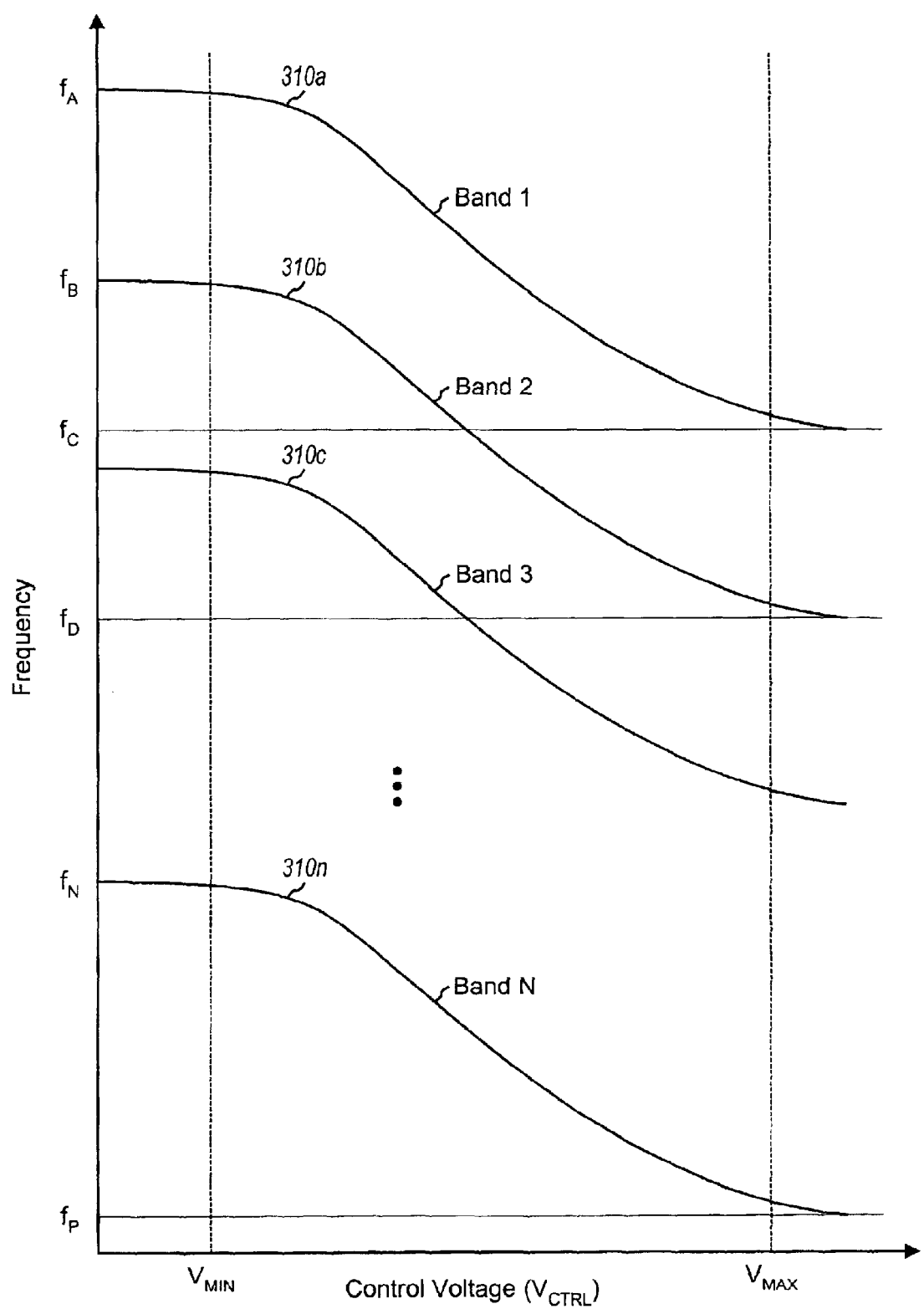
FIG. 3 is a diagram of the VCO gain transfer functions for the multiple frequency bands of the multi-band VCO.

FIG. 3 is a diagram of the VCO gain transfer functions for the multiple frequency bands of the multi-band VCO. Each frequency band is associated with a respective VCO gain transfer function (plot 310), which characterizes the frequency of the VCO output versus the $V_{CTRL}$ control signal amplitude (or voltage). As shown in FIG. 3, frequency band 1 covers the range from frequencies $f_A$ to $f_C$ (plot 310a), frequency band 2 covers the range from frequencies $f_B$ to $f_D$ (plot 310b), and so on, and frequency band N covers the range from frequencies $f_N$ to $f_P$ (plot 310n). The overall tuning range of the multi-band VCO is determined by the combination of all N frequency bands. More specifically, the tuning range spans from the highest frequency for frequency band 1 (which is approximately $f_A$) to the lowest frequency for frequency band N (which is approximately $f_P$).

As also shown in FIG. 3, the N frequency bands overlap such that $f_A > f_B > f_C > f_D > \ldots > f_N > f_P$. The overlapping is provided to ensure that at least one frequency band may be selected to provide the VCO output at any frequency within the entire tuning range. The amount of overlap between any two adjacent frequency bands is designed to compensate for process variations and different operating conditions. The range and center of each frequency band is determined by the set (or sets) of reactive components used for that band. The range and center of each frequency band would thus vary with variations in these reactive components. The frequency bands are designed such that they overlap by at least a small amount in the presence of expected worst-case process variations.

A main function of the PLL is to automatically acquire and track the frequency and phase of the reference signal, $S_{REF}$, if this signal is within the locking range of the PLL. If the PLL employs a single-band VCO with a tuning range that spans the entire locking range, then only circuitry that adjusts the frequency/phase of this single-band VCO would be needed to acquire and track the frequency of the reference signal. This circuitry would comprise the phase-frequency detector and the output driver/loop filter.

However, if the PLL employs a multi-band VCO, then additional circuitry is needed to select the proper frequency band for use from among the multiple frequency bands. This circuitry is provided by control unit 150. In an embodiment, control unit 150 selects the proper frequency band for use by monitoring the frequency of the VCO to determine whether or not it is in lock condition.

In one conventional implementation, the band selection for a multi-band VCO is achieved with a digital control unit that includes a frequency detector, a digital accumulator, and a state machine. The frequency detector determines the frequency error between the two inputs to the phase-frequency detector, i.e., $f_{VCO}$ and $f_{REF}$. The digital accumulator then accumulates the frequency error to provide an average frequency error. The state machine then makes a decision to switch frequency band based on the accumulator output.

This conventional design has several disadvantages. First, the length of the accumulator limits the accuracy of the frequency comparison between the two phase-frequency detector inputs. Second, the initial phase offset at the phase-frequency detector inputs adds uncertainty in the frequency comparison unless the accumulation interval is sufficiently long. Third, digital calibration is typically needed to determine the proper accumulator values for switching frequency bands. Fourth, complex digital circuits that are integrated along with analog circuit, such as digital accumulator and state machine, may cause a large amount of switching noise on the integrated circuit substrate. This may then necessitate the need to select frequency band prior to performing acquisition of the reference signal. If the PLL is not enabled and operated while the digital circuits perform coarse tuning to determine a particular frequency band to use, then a longer period of time would be needed to achieve frequency lock once the PLL is enabled (after the frequency band has been selected).

In another conventional implementation, a dual-loop topology is used, which includes a coarse and a fine tuning loop. The coarse tuning loop first search for the frequency band. Once the proper frequency band has been found, the fine tuning loop is enabled to synthesize the desired frequency. The decision circuit requires a supplemental loop to determine a particular frequency band to use. An additional set of phase detector, charge pump, and loop filter is required for this supplemental loop. This approach increases the complexity of the frequency synthesizer architecture as well as power consumption. In comparison, the technique shown in FIG. 1 utilizes a single loop and the band selection and the fine-tuning are done in the same fly.

Figure 4:
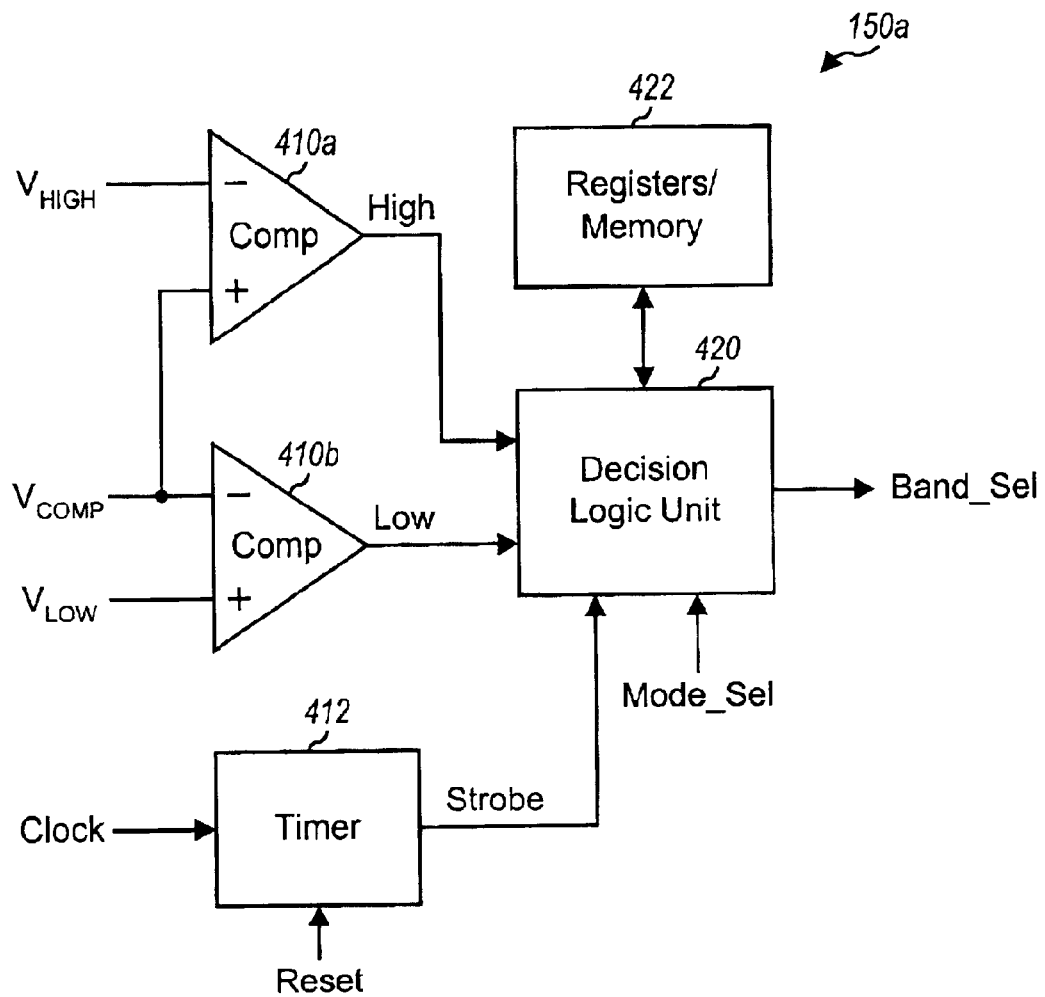
FIG. 4 is a block diagram of a control unit within the PLL.

FIG. 4 is a block diagram of a control unit 150a, which is a specific embodiment of control unit 150 in FIG. 1. In an aspect, the band selection for a multi-band VCO is achieved based on an analog signal to provide improved performance and minimize the amount of noisy digital circuitry. This analog signal may be the VCO control signal, $V_{CTRL}$, or a related signal. A main reason for reducing digital circuitry is because the digital switching noise may corrupt analog circuitry on the same substrate.

If the PLL is operational, then it would attempt to lock the frequency/phase of the VCO to that of the reference signal. In particular, the PLL adjusts the $V_{CTRL}$ control signal to move the frequency of the VCO toward the frequency of the reference signal. For a multi-band VCO, each frequency band covers a particular range of frequencies, which is associated with a range of values for the $V_{CTRL}$ control signal.

If the frequency of the reference signal is within the frequency range of the selected frequency band, then the $V_{CTRL}$ control signal will eventually be adjusted by the PLL to within the range of valid values (i.e., within the range defined by $V_{MAX}$ and $V_{MIN}$ in FIG. 3). Conversely, if the frequency of the reference signal is outside the frequency range of the selected frequency band, then the $V_{CTRL}$ control signal will be adjusted to be outside this valid value range. Typically, the control voltage will be moved to either the upper or lower rail by the PLL as it attempts to adjust the frequency of the VCO toward that of the reference signal, but is not able to achieve this because the frequency of the reference signal is not within the selected frequency band currently in use. In this case, the VCO is deemed to be out of range and another range would need to be selected.

The $V_{CTRL}$ control signal thus includes information regarding the frequency of the VCO as well as the lock condition. In one embodiment, the $V_{CTRL}$ control signal is monitored to select the proper frequency band for use. In an alternative embodiment, since there may be ripples on the $V_{CTRL}$ control signal when the PLL is operational (i.e., in closed-loop configuration), a filtered version of the control signal is monitored for the band selection. Referring back to FIG. 2, a filtered control signal, $V_{FCTRL}$, may be obtained from node 228 without using additional components. The $V_{FCTRL}$ filtered control signal is thus obtained by filtering the $V_{CTRL}$ control signal with a first order lowpass filter implemented by resistor 224 and capacitor 226 and having a bandwidth of $f=2\pi(C_1+C_2)/RC_1C_2$.

In the specific embodiment shown in FIG. 4, two comparators 410a and 410b are used to detect the loop information on a control signal, $V_{COMP}$. The $V_{COMP}$ control signal may be the $V_{CTRL}$ control signal, the $V_{FCTRL}$ filtered control signal, or some other signal related to the control of the VCO. Comparator 410a compares the $V_{COMP}$ control signal against a high threshold value, $V_{HIGH}$, and asserts its output if the $V_{COMP}$ control signal is greater than the high threshold value. Comparator 410b compares the $V_{COMP}$ control signal against a low threshold value, $V_{LOW}$, and asserts its output if the $V_{COMP}$ control signal is less than the low threshold value. The outputs of comparators 410a and 410b are respectively provided to the High and Low signals, which are in turn provided to a decision logic unit 420.

The high and low threshold values respectively define the upper and lower limits of the range of valid values for the $V_{COMP}$ control signal. The high and low threshold values may be determined based on various considerations such as, for example, (1) the characteristics of the output driver (or charge pump 210), (2) the characteristics of the VCO control input (i.e., the circuit within VCO 140 responsible for receiving the $V_{CTRL}$ control signal, (3) the upper and lower power supplies available for the PLL, and so on. In an embodiment, the high and low threshold values are set equal to the maximum and minimum values for the control signal (i.e., $V_{HIGH}=V_{MAX}$ and $V_{LOW}=V_{MIN}$).

A timer unit 412 receives a clock (which may be the reference signal or the divided down reference signal) and a Reset signal. Timer unit 412 resets itself to a known state whenever directed by the Reset signal. Thereafter, timer unit 412 provides a strobe (e.g., a pulse) on a Strobe signal whenever a particular amount of time has elapsed. The Strobe signal is provided to decision logic unit 420.

During the search for the proper frequency band to use for the PLL, a number of candidate frequency bands may be evaluated, one at a time to determine whether or not it is the proper one. In an embodiment, for each candidate frequency band to be evaluated, the PLL is given a sufficient amount of time to attempt frequency acquisition in this band. In an embodiment, a new candidate frequency band is selected for evaluation only if the PLL indicates that the current band is not the proper one after being given sufficient amount of time to achieve frequency lock. This timing mechanism sets the loop bandwidth for the digital decision circuit, and the loop filter component values sets the loop bandwidth for the analog PLL circuitry. In the case of switching from frequency band to frequency band too quickly, oscillation may occur. The following is an example.

When a new candidate frequency band is selected for evaluation, the control signal may temporarily sit at the upper or lower rail until the control signal is adjusted by the PLL toward the final value. The PLL requires some amount of time to move the frequency of the VCO toward that of the reference signal. Thus, even though the current frequency band may be the correct band, the control signal may be outside the valid value range for a short period of time. If a new frequency band is selected for evaluation because the PLL has not been given sufficient time to adjust the control signal, then an erroneous frequency band may be selected. Oscillation may then occur due to the premature switching from frequency band to frequency band.

The periodicity of the Strobe signal (i.e., the interval between two consecutive strobes on the Strobe signal) may thus be determined based on various considerations such as, for example, (1) the acquisition time of the PLL (2) the PLL loop bandwidth, and so on.

Decision logic unit 420 receives the High and Low signals from comparators 410a and 410b, the Strobe signal from timer unit 412, and a Mode_Sel control (which may be provided by a controller not shown in FIGS. 1 and 4 for simplicity). In an embodiment, the PLL may be operated in several operating modes, which may include:

Manual mode—a specific frequency band is manually selected for use (e.g., by the controller), and One-shot mode—the band selection is automatically performed by the decision logic unit to achieve frequency lock. After frequency locks, the digital noisy circuits are shut down and become inactive.

Stand-by-search mode—the band selection is automatically performed by the decision logic unit to achieve frequency lock. Once locked, the band selection operation will be stand-by. In case of temperature and process variation over time, the correct operational frequency band may be updated and shifted as necessary. The code memory is disabled.

One of the supported operating modes is selected at any given moment, and the selected operating mode is indicated by the Mode_Sel control.

Decision logic unit 420 selects the proper frequency band to use based on the various inputs and a particular selection scheme. Register/memory unit 422 provides storage for data and intermediate results for decision logic unit 420. For example, a set of registers within unit 422 may be used to store (1) a user-defined code for the selected frequency band in the manual mode, (2) an initial code for the first frequency band to be evaluated when attempting to lock to the frequency of the reference signal, and so on.

A code memory within unit 422 may be used to store a code used to derive the Band_Sel control. For a multi-band VCO, the N frequency bands may be individually identified by a code with B or more bits, where B=⌈log$_2$(N)⌉ and "⌈x⌉" denotes the ceiling of x (i.e., the next higher integer value for x). In one embodiment, the Band_Sel control is set directly equal to the code stored in the code memory. In another embodiment, the code stored in the code memory may be decoded to obtain the Band_Sel control. For example, the Band_Sel control may comprise one control signal for each of the N frequency bands, and the N individual control signals may be obtained by decoding a B-bit code.

Figure 5:
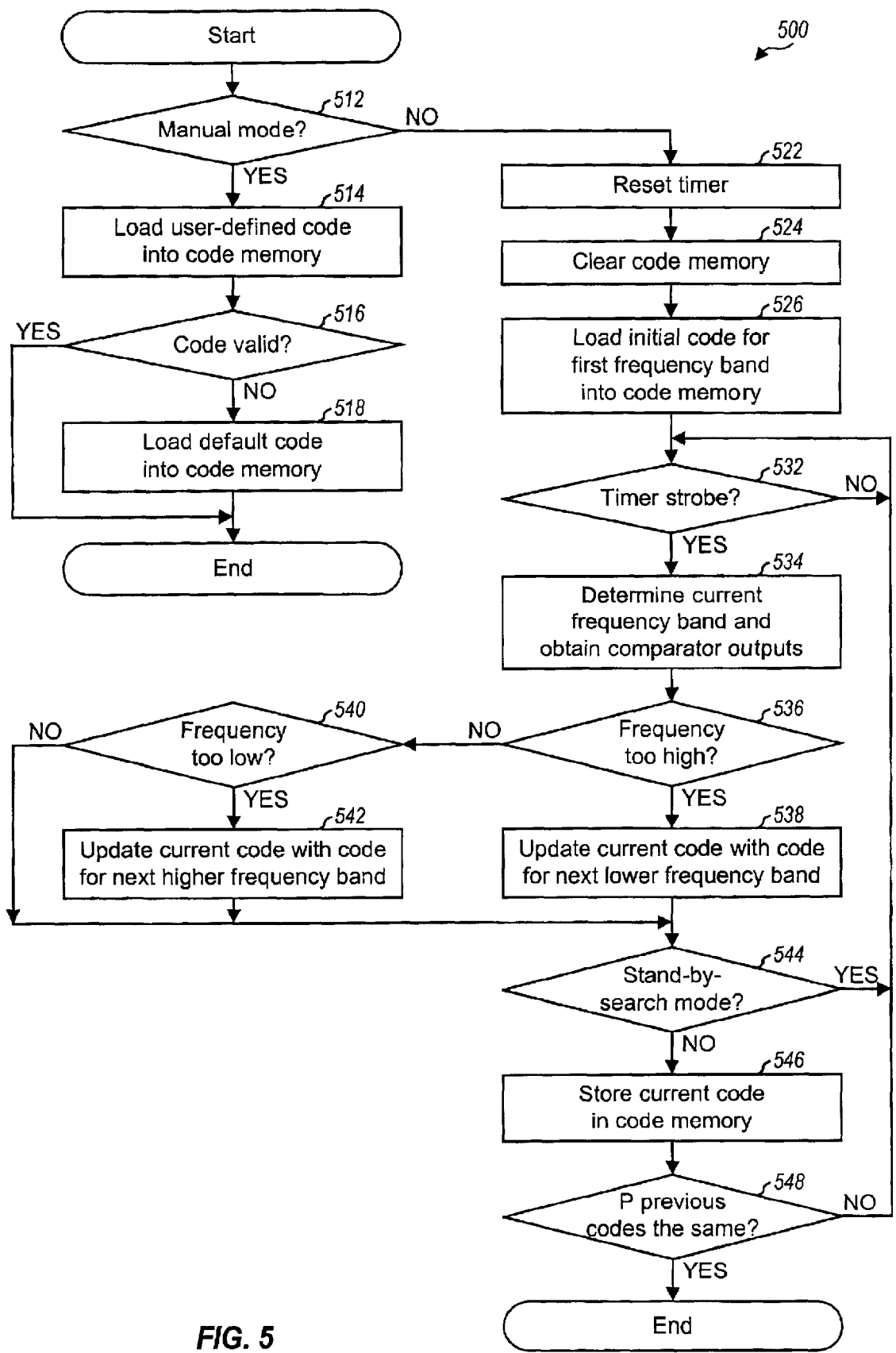
FIG. 5 is a flow diagram of a process for selecting the proper frequency band of the multi-band VCO for use.

FIG. 5 is a flow diagram of a process 500 for a specific selection scheme implemented by the decision logic unit to select the proper frequency band for the multi-band VCO. This scheme supports three operating modes—the manual mode, the one-shot mode, and the stand-by-search mode described above.

Initially, a determination is made whether or not the PLL is operated in the manual mode (step 512). This may be achieved by checking the Mode_Sel control provided to the decision logic unit If the PLL is operated in the manual mode, then a user-defined code indicative of the selected frequency band is loaded into memory (step 514). The user-defined code may initially be provided by another source (e.g., the controller) and stored in a register within unit 422. This user-defined code would then be retrieved from the register and stored in a code memory within unit 422.

A determination is then made whether or not the user-defined code is valid (step 516). As noted above, a code with B or more bits may be used to individually identify the N frequency bands of the multi-band VCO. If more code values are available than the number of frequency bands, then some of these code values are invalid. For example, if there are 9 frequency bands, then at least four bits would be needed for the code (i.e., B≧4), and at least 7 code values would be invalid. Step 516 is performed to ensure that the user-defined code is a valid code value. If it is determined that the user-defined code is valid, then the process terminates. Otherwise, a default code is retrieved from a second register and loaded into the code memory (step 518), and the process thereafter terminates.

Back at step 512, if the PLL is not operated in the manual mode, then it is operated in the either the one-shot mode or the stand-by-search mode. For both the one-shot mode and the stand-by-search mode, the timer unit is initially reset (step 522) and the code memory is cleared (step 524). An initial code for the first frequency band to be evaluated is then loaded into the code memory (step 526). The initial code may be stored in a third register within unit 422 (e.g., hard-wired in the register or provided by the controller) and may thereafter be retrieved and provided to the code memory within unit 422.

A determination is then made whether or not a timer strobe has been received (step 532). As noted above, the timer unit may be designed to provide a periodic strobe, such as a periodic pulse on the Strobe signal. The time interval between two consecutive strobes may be determined by the amount of time needed to achieve frequency lock by the PLL. If the next strobe has not been received, then the process returns to step 532 and waits. Otherwise, if the strobe has been received, then the current frequency band is determined and the comparator outputs are obtained from the High and Low signals (step 534).

A determination is then made whether or not the current frequency band is too high (step 536). For the VCO gain transfer functions shown in FIG. 3, frequency is inversely related to control voltage. In this case, the current frequency band is deemed to be too high if the High signal is asserted (e.g., to logic high), which occurs due to the PLL attempting to move the frequency of the VCO lower by increasing the control voltage past the $V_{HIGH}$ threshold value. If the current frequency band is too high, then the current code is updated with the code for the next lower frequency band (step 538).

Otherwise, if the current frequency band is not too high, then a determination is made whether or not the current frequency band is too low (step 540). The current frequency band is deemed to be too low if the Low signal is asserted, which occurs due to the PLL attempting to move the frequency of the VCO higher by decreasing the control voltage below the $V_{LOW}$ threshold value. If the current frequency band is too low, then the current code is updated with the code for the next higher frequency band (step 542).

A determination is then made whether or not the PLL is operated in the stand-by-search mode. This may be achieved by checking the Mode_Sel control provided to the decision logic (step 544). If the stand-by-mode is chosen, then the current code is not stored in the code memory and the process returns to step 532 to determine the frequency band for the next strobe interval. Otherwise, if the one-shot mode is chosen, then the current code (which may have been updated in either step 538 or 542) is stored in the code memory (step 546).

In an embodiment, the current frequency band is deemed to be the proper one to use if the same frequency band is selected for P consecutive strobe intervals in one-shot mode. For this embodiment, a determination is made whether or not the P previous codes stored in the code memory are the same (step 548). If the answer is yes, then the process terminates. Otherwise, the process returns to step 532 to determine the frequency band for the next strobe interval.

Although not shown in FIG. 5 for clarity, other checks may be added to terminate the process based on some other criteria. For example, an error may be declared if the proper frequency band cannot be determined within a particular maximum number of strobe intervals.

The PLL with self-selecting multi-band VCO may be used for various applications including wireless communication, networking, and other applications. For example, this PLL may be implemented within a receiver, a transmitter, an application specific integrated circuit (ASIC), a digital signal processor, and so on. Moreover, the PLL may be implemented using various technologies such as CMOS, bipolar, GaAs, and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A phase-lock loop (PLL) comprising:
   a detector configured to receive first and second signals and provide a detector output, wherein the first signal is related to a reference signal to be locked to and the second signal is related to a VCO signal;
   a loop filter configured to received and filter the detector output to provide a control signal;

a multi-band voltage controlled oscillator (VCO) configured to receive the control signal and a select signal, select one of a plurality of frequency bands based on the select signal, and provide the VCO signal at a frequency within the selected frequency band based on the control signal; and a control unit configured to receive a third signal and provide the select signal, wherein the third signal is related to the control signal, the control unit comprising:
- a first comparator configured to receive the third signal and a first threshold value and provide a first status signal indicative of whether or not the frequency of the VCO signal is too high, and
- a second comparator configured to receive the third signal and a second threshold value and provide a second status signal indicative of whether or not the frequency of the VCO signal is too low, and
- wherein the select signal is derived based on the first and second status signals.

2. The phase-locked loop of claim 1, wherein the third signal is a filtered version of the control signal.

3. The phase-locked loop of claim 2, wherein the filtered version of the control signal is obtained from a node within the loop filter.

4. The phase-locked loop of claim 1, wherein the third signal is the control signal.

5. The phase-locked loop of claim 1, further comprising:
an output driver configured to receive the detector output and provide a drive signal, and wherein the loop filter is configured to filter the drive signal to provide the control signal.

6. The phase-locked loop of claim 5, wherein the output driver is configured to provide approximately equal source and sink capability for the drive signal.

7. The phase-locked loop of claim 1, wherein the first and second threshold values define a range of valid values for the third signal.

8. The phase-locked loop of claim 1, wherein the control unit further includes a timer unit configured to provide a timing signal, and wherein the first and second status signals are detected at times determined by the timing signal.

9. A phase-locked loop comprising:
- a detector configured to receive first and second signals and provide a detector output, wherein the first signal is related to a reference signal to be locked to and the second signal is related to a VCO signal;
- a loop filter configured to received and filter the detector output to provide a control signal;
- a multi-band voltage controlled oscillator (VCO) configured to receive the control signal and a select signal, select one of a plurality of frequency bands based on the select signal, and provide the VCO signal at a frequency within the selected frequency band based on the control signal; and
- a control unit configured to receive a third signal and provide the select signal, wherein the third signal is related to the control signal,
- the control unit further configured to evaluate one or more candidate frequency bands to determine a proper frequency band for use.

10. The phase-locked loop of claim 9, wherein a candidate frequency band is deemed as being the proper frequency band when it does not change within a particular amount of time.

11. A phase-locked loop comprising:
- a detector configured to receive first and second signal and provide a detector output, wherein the first signal is related to a reference signal to be locked to and the second signal is related to a VCO signal;
- a loop filter configured to received and filter the detector output to provide a control signal;
- a multi-band voltage controlled oscillator (VCO) configured to receive the control signal and a select signal, select one of a plurality of frequency bands based on the select signal, and provide the VCO signal at a frequency within the selected frequency band based on the control signal; and
- a control unit configured to receive a third signal and provide the select signal, wherein the third signal is related to the control signal,
- wherein the phase-locked loop is operable in a plurality of operating modes.

12. The phase-locked loop of claim 11, wherein the plurality of operating modes including a first mode whereby a specific frequency band may be commanded for use.

13. The phase-locked loop of claim 11, wherein the plurality of operating modes include a second mode whereby a proper frequency band is automatically selected for use by the control unit.

14. The phase-locked loop of claim 11, wherein the plurality of operating modes includes a third mode whereby a proper frequency band is automatically selected, one time, for use by the control unit and then maintained.

15. The phase-locked loop of claim 11, wherein the plurality of frequency bands are designed to overlap each other by at least a particular minimum amount.

16. The phase-locked loop comprising:
- a detector configured to receive first and second signal and provide a detector output, wherein the second signal is related to a VCO signal;
- a loop filter configured to received and filter the detector output to provide a control signal;
- a multi-band voltage controlled oscillator (VCO) configured to receive the control signal and a select signal, select one of a plurality of frequency bands based on the select signal, and proved the VCO signal at a frequency within the selected frequency band based on the control signal; and
- a control unit configured to receive an analog signal from the loop filter and provide the select signal, wherein the analog signal is related to the control signal,
- the control unit further configured to evaluate one or more candidate frequency bands to determine a proper frequency band for use.

17. The phase-locked loop of claim 16, wherein the analog signal is a filtered version of the control signal.

18. An integrated circuit comprising:
- a detector configured to receive first and second signals and provide a detector output, wherein the first signal is related to a reference signal to be locked to and the second signal is related to a VCO signal;
- a loop filter configured to received and filter the detector output to provide a control signal;
- a multi-band voltage controlled oscillator (VCO) configured to receive the control signal and a select signal, select one of a plurality of frequency bands based on the select signal, and provide the VCO signal at a frequency within the selected frequency band based on the control signal; and a control unit configured to receive a third signal and provide the select signal, wherein the third signal is related to the control signal, the control unit further configured to evaluate one or more candidate frequency bands to determine a proper frequency band for use.

19. The integrated circuit of claim 18, wherein the integrated circuit is implemented in CMOS.

20. A method for selecting a frequency band for use from among a plurality of frequency bands of a multi-band VCO, comprising:

identifying a current frequency band being evaluated;

receiving a first status signal indicative of whether or not the frequency of a VCO signal from the multi-band VCO is too high;

receiving a second status signal indicative of whether or not the frequency of the VCO signal is too low;

selecting a next lower frequency band for evaluation when the first status signal indicates that the frequency of the VCO is too high;

selecting a next higher frequency band for evaluation when the second status signal indicates that the frequency of the VCO signal is too low; and providing the current frequency band as the frequency band for use based on the first and second status signals.

21. The method of claim 20, wherein the current frequency band is provided as the frequency band to use when it has not changed for a particular amount of time.

22. The method of claim 20, wherein the first and second status signals are derived using a timing signal.

23. The method of claim 20, wherein the first and second status signals are derived based on a version of a control signal for the multi-band VCO.

* * * * *